United States Patent
Liu et al.

(10) Patent No.: US 8,575,691 B2
(45) Date of Patent: Nov. 5, 2013

(54) LATERAL-DIFFUSION METAL-OXIDE SEMICONDUCTOR DEVICE

(75) Inventors: Tseng-Hsun Liu, Taipei (TW); Chiu-Ling Lee, Hsinchu (TW); Zheng-Hong Chen, Taoyuan County (TW); Yi-Ming Wang, Hsinchu (TW); Ching-Ming Lee, Miaoli County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 371 days.

(21) Appl. No.: 12/730,245

(22) Filed: Mar. 24, 2010

(65) Prior Publication Data

US 2011/0233673 A1 Sep. 29, 2011

(51) Int. Cl.
*H01L 29/66* (2006.01)

(52) U.S. Cl.
USPC .......... 257/335; 257/336; 257/343; 257/339; 257/328; 257/E21.346

(58) Field of Classification Search
USPC .......... 257/343, 336, 339, 335, 328, E21.346, 257/E29.261, E29.256, E29.355
See application file for complete search history.

(56) References Cited

U.S. PATENT DOCUMENTS

| | | | |
|---|---|---|---|
| 7,067,365 B1 | 6/2006 | Lee | |
| 7,361,955 B2* | 4/2008 | Kao | 257/339 |
| 7,385,274 B2 | 6/2008 | Lee | |
| 7,655,980 B1* | 2/2010 | Chao et al. | 257/335 |
| 8,110,853 B2* | 2/2012 | Voldman | 257/170 |
| 2008/0197408 A1* | 8/2008 | Disney et al. | 257/335 |
| 2009/0242982 A1* | 10/2009 | Cai | 257/338 |
| 2010/0001343 A1* | 1/2010 | Choi et al. | 257/339 |

* cited by examiner

*Primary Examiner* — Julio J Maldonado
*Assistant Examiner* — Cory Eskridge
(74) *Attorney, Agent, or Firm* — Winston Hsu; Scott Margo

(57) ABSTRACT

A method for fabricating a lateral-diffusion metal-oxide semiconductor (LDMOS) device is disclosed. The method includes the steps of: providing a semiconductor substrate; forming a first region and a second region both having a first conductive type in the semiconductor substrate, wherein the first region not contacting the second region; and performing a thermal process to diffuse the dopants within the first region and the second region into the semiconductor substrate to form a deep well, wherein the doping concentration of the deep well is less than the doping concentration of the first region and the second region.

9 Claims, 5 Drawing Sheets

LATERAL-DIFFUSION METAL-OXIDE SEMICONDUCTOR DEVICE

BACKGROUND OF THE INVENTION

1. Field of the Invention

The invention relates to a high voltage semiconductor device, and more particularly, to a lateral-diffusion metal-oxide semiconductor (LDMOS) device with high breakdown voltage and low on-state resistance ($R_{on}$).

2. Description of the Prior Art

Controllers, memories, circuits of low-voltage operation and power devices of high-voltage operation have been largely integrated together to achieve a single-chip system. The power device, such as vertical double-diffusion metal-oxide-semiconductor (VDMOS), insulated gate bipolar transistor (IGBT) or lateral diffusion MOS (LDMOS), has been employed to increase power switching efficiency and decrease the loss of energy resources. It is often required that the switching transistors withstand high breakdown voltages and operate at a low on-resistance.

Double diffuse drain (DDD) technology has been extensively applied to the source/drain (S/D) in order to provide a higher breakdown voltage. The DDD structure suppresses the hot electron effect caused by the short channel of the MOS transistor to further avoid electrical breakdown of the source/drain under high operational voltages. The LDMOS transistors are particularly prevalent because they can operate with a high efficiency and their planar structure allows for easy integration on a semiconductor die with other circuitry.

A conventional LDMOS is typically formed in a substrate having a first conductive type, such as a p-type semiconductor substrate for a LDNMOS, in which the p-type substrate also includes a deep n-well and a p-well and a n-well disposed in the deep n-well. A drain region of the LDNMOS is disposed in the n-well, a source region is disposed in the p-well, and the drain region and the source region are laterally connected to a gate structure of the LDMOS.

However, the doping concentration of the deep n-well fabricated by conventional method is typically uniform, hence the concentration difference at the PN junction between the deep n-well and the p-well is substantially high, which limits the LDMOS device to obtain a satisfactory breakdown voltage. If the concentration of the deep n-well were to be lowered to achieve a higher breakdown voltage, the concentration of the surrounding device would be affected immediately. Hence, how to improve the current process for fabricating a LDMOS device with higher breakdown voltage has become an important task in this field.

SUMMARY OF THE INVENTION

It is an objective of the present invention to provide a LDMOS and method for fabricating the same to resolve the aforementioned issue of unable to achieve higher breakdown voltage.

According to a preferred embodiment of the present invention, a lateral-diffusion metal-oxide semiconductor (LDMOS) device is disclosed. The LDMOS device includes: a semiconductor substrate; at least one gate structure disposed on surface of the semiconductor substrate; a first well having a first conductive type, disposed in the semiconductor substrate adjacent to one side of the gate structure; a first isolation structure disposed in an upper portion of the first well and under a portion of the gate structure; a drain region disposed in the first well; a second isolation structure disposed in the semiconductor substrate adjacent to another side of the gate structure; a second well having a second conductive type, disposed in the semiconductor substrate between the second isolation structure and the gate structure; a source region disposed in the second well; and a deep well having the second conductive type disposed in the semiconductor substrate, wherein the deep well comprises a first region disposed under the first isolation structure and the first well and a second region disposed under the second isolation structure and a portion of the second well, and the doping concentration of the deep well is less than the doping concentration of the first region and the second region.

According to another aspect of the present invention, a method for fabricating a LDMOS device is disclosed. The method includes the steps of: providing a semiconductor substrate having a first conductive type; forming a first deep well and a second deep well both having a second conductive type in the semiconductor substrate, wherein the first deep well not contacting the second deep well; and performing a thermal process to diffuse the dopants within the first deep well and the second deep well into the semiconductor substrate to form a third deep well, wherein the doping concentration of the third deep well is less than the doping concentration of the first deep well and the second deep well.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
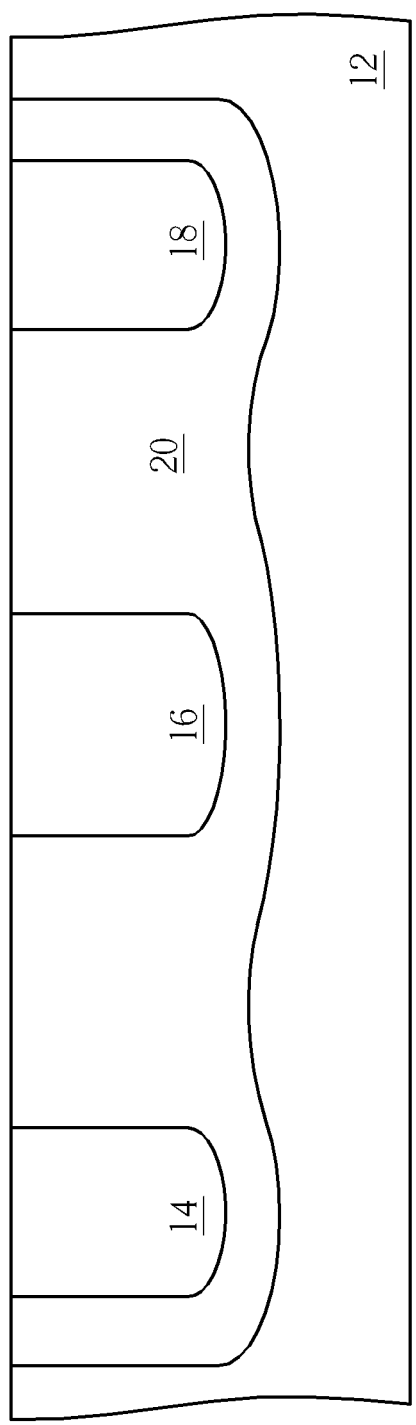
FIGS. 1-3 illustrate a method of fabricating a LDMOS device according to a preferred embodiment of the present invention.
Figure 2:
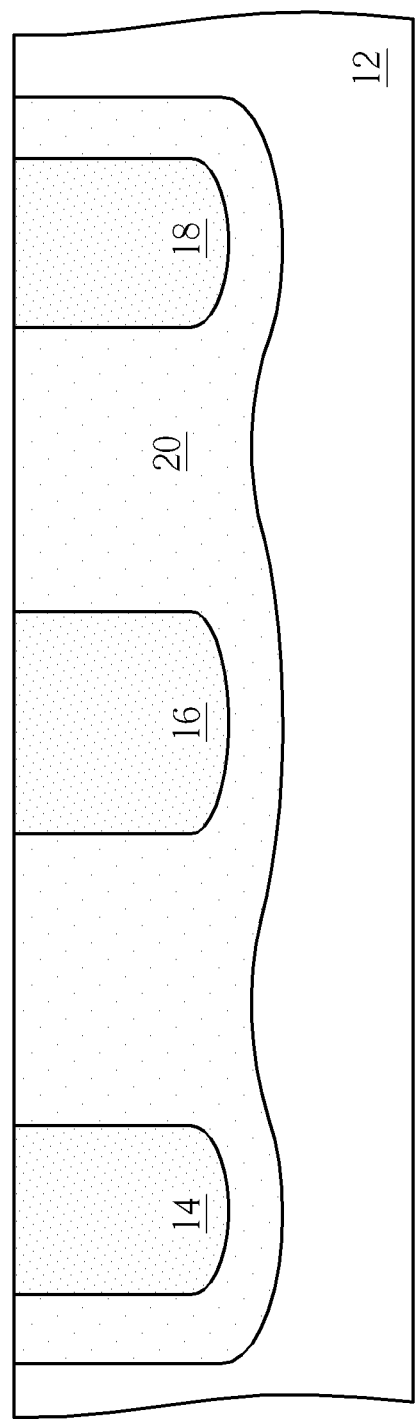
Figure 3:
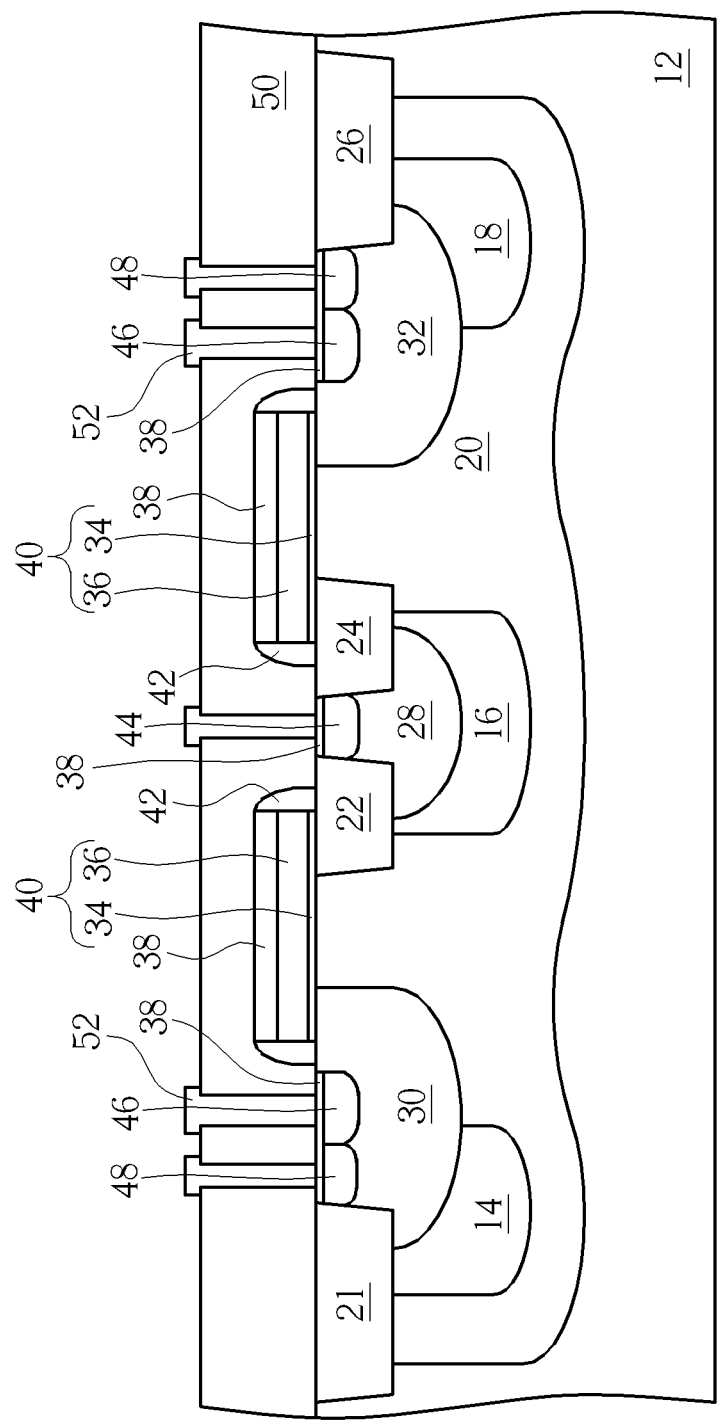

Referring to FIGS. 1-3, FIGS. 1-3 illustrate a method of fabricating a LDMOS device according to a preferred embodiment of the present invention. It is appreciated that in the drawings and in the following descriptions, a LDMOS device with dual gates is illustrated to highlight the feature of the present invention. However, the following process could also be applied to fabricate a LDMOS device with one single gate, which is also within the scope of the present invention. As shown in FIG. 1, a p-type semiconductor substrate 12 is first provided, and an ion implantation is conducted by using a patterned photoresist (not shown) as mask to implant n-type dopants (such as phosphorus) into the semiconductor substrate 12 for forming a plurality of regions 14, 16, 18. Preferably, the regions 14, 16, 18 formed in the substrate 12 do not contact each other, and it should be noted that despite three regions 14, 16, 18 are formed in the semiconductor substrate 12, the quantity of the regions could be adjusted according to the demand of the product, and not limited thereto.

Next, a thermal process is performed by using a temperature greater than 1000° C. to drive-in the dopants within the regions 14, 16, 18 to the surrounding semiconductor substrate 12 for forming a deep n-well 20. In this embodiment, the temperature of the thermal process is preferably at 1150° C., and the duration of the process is preferably greater than 10 hours. Thereafter, another thermal process could be performed selectively to further diffuse the dopants within the regions 14, 16, 18 into the surrounding semiconductor substrate 12 while maintaining the existence of all the regions 14, 16, 18, and the deep n-well 20. According to an embodiment of the present invention, one or more thermal process could be performed to gradually diffuse the dopants within the regions 14, 16, 18 and the deep n-well 20 into the surrounding substrate 12. Preferably, the fabrication parameters used in the first thermal process could also be applied to the second thermal process. Hence, the second thermal process is also performed under a temperature of 1150° C. and preferably for greater than 10 hours. It should be noted that if the regions formed in substrate 12 were n-type regions, such as in this embodiment, two thermal processes are preferably conducted to diffuse the dopants within the regions. However, if the regions formed in the substrate 12 were deep p-type regions, only one thermal process is preferably conducted for diffusing the dopants within the region.

Referring now to FIG. 2, which illustrates a comparison between the doping concentrations of the n-type regions and the surrounding deep n-well. As shown in FIG. 2, the n-type regions 14, 16, 18 formed through ion implantation preferably has high concentration, hence the concentration of the regions 14, 16, 18 is represented by dense dots in the figure. As the surrounding deep n-well 20 formed through the diffusion of the regions 14, 16, 18 has lower doping concentration, the concentration of the deep n-well 20 is represented by sparse dots.

Next, as shown in FIG. 3, an isolation fabrication is conducted to form a plurality of isolation structures 21, 22, 24, 26, such as shallow trench isolations (STIs) in the semiconductor substrate 12. In addition to using STIs for creating isolation structures 21, 22, 24, 26, a local oxidation (LOCOS) could also be conducted to form a plurality of field oxides (not shown) in the regions 14, 16, 18 for servings as isolation structures. The field oxides are preferably formed on the top portion of the regions 14, 16, 18 while slightly protruding from the surface of the semiconductor substrate 12. Despite the regions 14, 16, 18 are formed before the isolation structures 21, 22, 24, 26 in this embodiment, the fabrication of these two elements is not limited to this order. Hence, the present invention could also form the isolation structures 21, 22, 24, 26 before forming the regions 14, 16, 18, which is also within the scope of the present invention.

Next, a n-type ion implantation is conducted to implant n-type dopants into the deep n-well 16 with a selective thermal process to form a n-well 28, and a p-type ion implantation is performed to implant p-type dopants into the regions 14, 18 with selective thermal process to form two p-wells 30, 32. Despite the n-well 28 is formed before the p-wells 30, 32 in this embodiment, the order and quantity of the n-well 28 and the p-wells 30, 32 could be adjusted according to the demand of the product. Hence, the p-wells 30, 32 could be formed before the n-well 28, which is also within the scope of the present invention.

Next, a gate structure fabrication is performed by first depositing an oxide layer (not shown) and a polysilicon layer (not shown) on surface of the semiconductor substrate 12. A photo-etching process is conducted thereafter to remove a portion of the polysilicon layer and the oxide layer for forming a gate structure 40 composed of a gate dielectric layer 34 and a gate electrode 36. A spacer 42 composed of oxides or nitrides is then formed on the sidewall of the gate structure 40.

An ion implantation is then performed to implant heavy dopants in to the n-well 28 adjacent to one side of the gate structure 40 for forming a n-type drain region 44 and two n-type source regions 46 in the p-wells 30, 32 adjacent to the other side of the gate structure 40. Two p-body contact region 48 are then formed in the p-wells 30, 32 adjacent to the source regions 46 through another ion implantation. Next, a thermal process could be conducted to drive-in the dopants implanted into the above drain region 44, source region 46, and p-body contact region 48. Thereafter, a salicide process is conducted to form a plurality of salicide layers 38 on the surface of the drain region 44, the source region 46, the p-body contact region 48 and the gate structure 40.

An interlayer dielectric layer 50 composed of nitrides or oxides is then deposited on the semiconductor substrate 12 to cover the gate structure 40, the spacer 42, the source region 46, the drain region 44, and the p-body contact region 48, and a contact plug fabrication is performed to form a plurality of contact plugs 52 in the interlayer dielectric layer 50 for connecting the source region 46, the drain region 44, and the p-body contact region 48. This completes the fabrication of a LDMOS device according to a preferred embodiment of the present invention.

Figure 4:
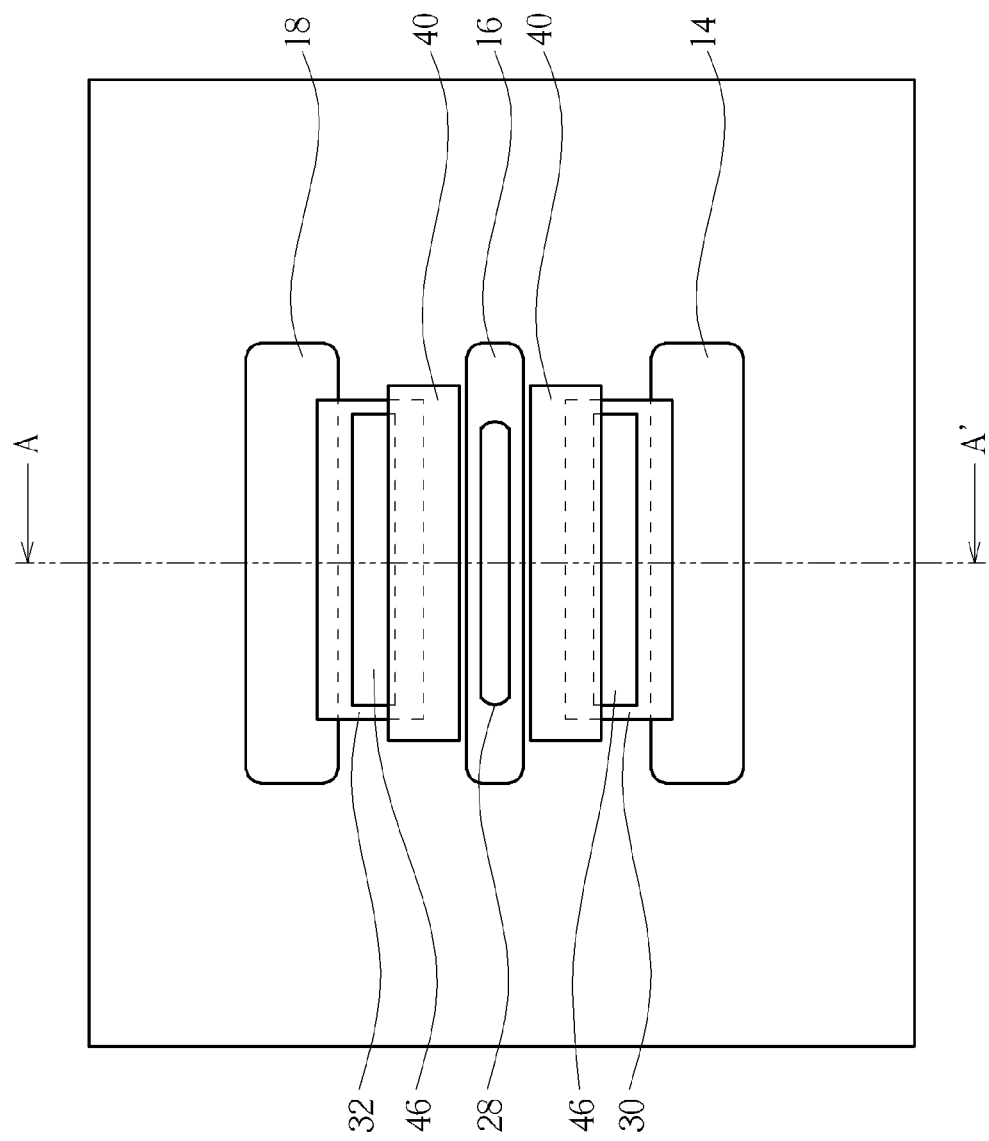
FIG. 4 illustrates a top view of the LDMOS device shown in FIG. 3.
Figure 5:
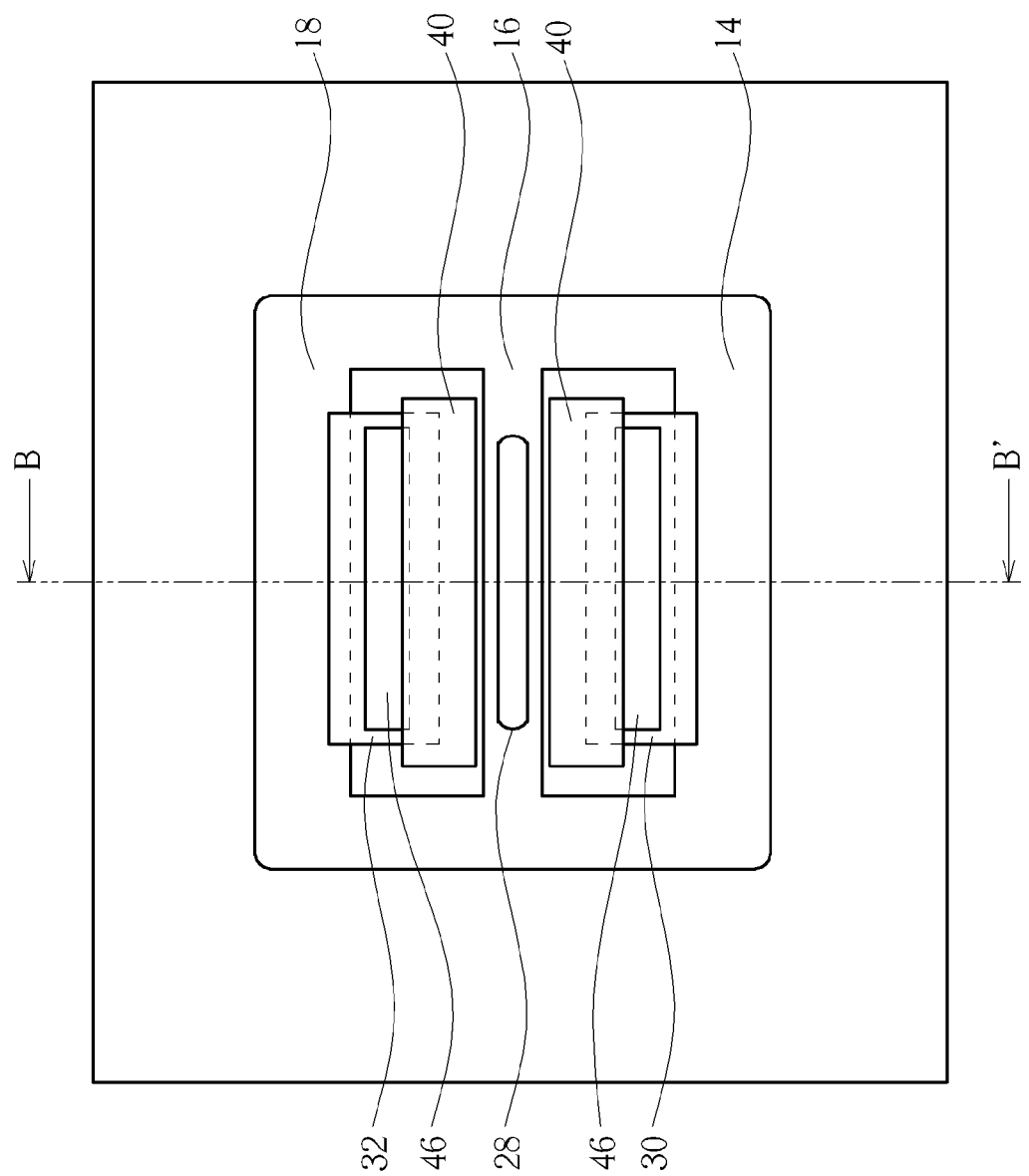
FIG. 5 illustrates a top view of a LDMOS device according to another embodiment of the present invention.

Referring to FIGS. 3-5, FIG. 3 illustrates a structural view of a LDMOS device revealed from the cross-sectional line AA' of FIG. 4 or from the cross-sectional line BB' of FIG. 5 according to a preferred embodiment of the present invention, FIG. 4 illustrates a top view of the LDMOS device shown in FIG. 3, and FIG. 5 illustrates a top view of a LDMOS device according to another embodiment of the present invention. Preferably, the design of the three regions 14, 16, 18 and the surrounding elements are emphasized in FIGS. 4-5 and in order to clearly indicate the relative position of the doping regions, some elements revealed in FIG. 3 are omitted.

As shown in FIGS. 3 and 4, the LDMOS device of the present invention preferably includes a p-type semiconductor substrate 12; two gate structures 40 disposed on the surface of the semiconductor substrate 12; a n-well 28 disposed in the semiconductor substrate 12 adjacent to one side of the gate structure 40; a plurality of isolation structures 22, 24 disposed in the top portion of the n-well 28 and under a portion of the gate structure 40; a drain region 44 disposed in the n-well 28, a plurality of isolation structures 21, 26 disposed in the semiconductor substrate 12 adjacent to another side of the gate structure 40; two p-wells 30, 32 disposed in the semiconductor substrate 12 between the isolation structures 21, 26 and the gate structures 40; a source region 46 disposed in the p-well 30; and a p-body contact region 48 disposed in the p-well 30 and between the source region 46 and the isolation structure 21.

Despite the LDMOS device of the present embodiment is employed with a duel gate structure design and a shared drain region 44, the aforementioned fabrication process could also be adjusted to form a LDMOS device with a single gate structure and a non-shared drain region. Moreover, in addition using p-type semiconductor substrate and n-type deep wells as illustrated above, the property of the deep wells and other ion wells could also be reversed, such as by forming deep wells and ion wells with reversed property on the same p-type substrate, which is also within the scope of the present invention.

As shown in the embodiment of FIG. 3, the LDMOS device also includes a deep n-well 16 disposed under the isolation structures 22, 24 and the n-well 28, and two regions 14, 18 disposed under the isolation structures 21, 26 and part of the p-wells 30, 32 respectively, in which the regions 14 and 18 do not contact the deep n-well 16. Another deep n-well 20 with lower doping concentration is formed in the surrounding semiconductor substrate 12 to enclose the entire LDMOS device. Preferably, the distance between the regions 14, 18 and the deep n-well 16 is two to eight times the width of each regions 14, 16, 18. Despite three independent regions 14, 16,

18 are disclosed in the embodiment shown in FIG. 3, the design of the regions is not limited thereto. For instance, as shown in FIG. 4, the regions 14, 16, 18 could also be formed to contact and connect each other while surrounding the entire gate structure 40 to form a 8-shaped layout pattern, which is also within the scope of the present invention.

Overall, the present invention preferably implants a plurality of n-type regions in a p-type semiconductor substrate, and then uses at least one thermal process to drive-in the dopants from the n-type regions to the surrounding semiconductor substrate for forming a single deep n-well with at least two different doping concentrations. Isolation structures and p-wells and n-wells are formed thereafter. By following this design, a lower concentration difference is achieved between the PN junction of the deep n-well 20 and the p-wells 30, 32 and the LDMOS fabricated could obtain a relatively higher breakdown voltage and substantially lower on-state resistance ($R_{on}$). According to a preferred embodiment of the present invention, the breakdown voltage of the LDMOS fabricated under a 0.18 μm is increased from conventional 50 volts to 70 volts, and the on-state resistance is preferably reduced from 138 ohms to 70 ohms.

Those skilled in the art will readily observe that numerous modifications and alterations of the device and method may be made while retaining the teachings of the invention.

What is claimed is:

1. A lateral-diffusion metal-oxide semiconductor (LDMOS) device, comprising:
    a semiconductor substrate;
    at least one gate structure disposed on surface of the semiconductor substrate;
    a first well having a first conductive type, disposed in the semiconductor substrate adjacent to one side of the gate structure;
    a first isolation structure disposed in an upper portion of the first well and under a portion of the gate structure;
    a drain region disposed in the first well;
    a second isolation structure disposed in the semiconductor substrate adjacent to another side of the gate structure;
    a second well having a second conductive type, disposed in the semiconductor substrate between the second isolation structure and the gate structure;
    a source region disposed in the second well; and
    a deep well having the first conductive type disposed in the semiconductor substrate, wherein the deep well comprises a first region having the first conductive type and a second region having the first conductive type, the doping concentration of the first region is substantially the same as the doping concentration of the second region, wherein the first region is disposed under the first isolation structure and the first well, and wherein the second region is disposed under the second isolation structure and a portion of the second well, and the doping concentration of the deep well is less than the doping concentration of the first region and the second region.

2. The LDMOS device of claim 1, further comprising a doping region having the second conductive type disposed in the second well and between the source region and the second isolation structure.

3. The LDMOS device of claim 1, wherein the distance between the first region and the second region is two to eight times the width of the first region or the second region.

4. The LDMOS device of claim 1, wherein the first conductive type is p-type and the second conductive type is n-type.

5. The LDMOS device of claim 1, wherein the first conductive type is n-type and the second conductive type is p-type.

6. The LDMOS device of claim 1, wherein each of the first isolation structure and the second isolation structure comprises a shallow trench isolation.

7. The LDMOS device of claim 1, wherein the semiconductor substrate comprises a p-type semiconductor substrate.

8. The LDMOS device of claim 1, wherein the first region not contacting the second region.

9. The LDMOS device of claim 1, wherein the first region contacts the second region and the first region and the second region surrounding the gate structure.

* * * * *